(12) United States Patent
Guo et al.

(10) Patent No.: US 11,985,778 B1
(45) Date of Patent: May 14, 2024

(54) BRACKET ASSEMBLY

(71) Applicant: Toshiba Global Commerce Solutions, Inc., Durham, NC (US)

(72) Inventors: Jui-Chieh Guo, Taipei (TW); Dan Kelaher, Fuquay-Varina, NC (US)

(73) Assignee: TOSHIBA GLOBAL COMMERCE SOLUTIONS, INC, Durham, NC (US)

( * ) Notice: Subject to any disclaimer, the term of this patent is extended or adjusted under 35 U.S.C. 154(b) by 0 days.

(21) Appl. No.: 18/103,152

(22) Filed: Jan. 30, 2023

(51) Int. Cl.
*F16M 11/04* (2006.01)
*H05K 5/02* (2006.01)
*A47B 97/00* (2006.01)

(52) U.S. Cl.
CPC ......... *H05K 5/0234* (2013.01); *F16M 11/041* (2013.01); *A47B 2097/005* (2013.01)

(58) Field of Classification Search
CPC ... F16M 11/041; A47B 2097/005; G09F 7/18; H05K 5/0234
USPC .......................... 248/221.12, 222.12, 223.21
See application file for complete search history.

(56) References Cited

U.S. PATENT DOCUMENTS

| | | | | |
|---|---|---|---|---|
| 4,502,656 A * | 3/1985 | Zeitler | ................ | F16M 13/00 248/346.03 |
| 4,893,777 A * | 1/1990 | Gassaway | ........... | E05B 73/0082 211/8 |
| 5,588,631 A * | 12/1996 | Yee | ........................ | B60R 11/06 224/547 |
| 6,023,867 A * | 2/2000 | Gagne | ....................... | G09F 7/06 40/606.15 |
| 7,175,152 B2 * | 2/2007 | Dittmer | .................. | F16M 13/02 248/222.51 |
| 7,506,850 B2 * | 3/2009 | Chang | ................. | F16M 11/2021 248/221.11 |
| 9,732,784 B2 * | 8/2017 | Clouser | .................. | F16B 47/003 |
| 9,945,509 B2 * | 4/2018 | Barnes | ................. | F16M 11/041 |

(Continued)

OTHER PUBLICATIONS

Amazon, "Mounting Dream TV Mount for Most 37-70 Inch TV, Universal Tilt TV Wall Mount Fit 16", 18", 24" Stud with Loading Capacity 132lbs, Max Vesa 600 x 400mm, Low Profile Flat Wall Mount Bracket MD2268-LK", Sep. 5, 2014, pp. 1-10, retrieved on Oct. 12, 2022, retrieved from internet: https://www.amazon.com/Mounting-Dream-600x400mm-Capacity-MD2268-LK/dp/B00NKYYMAW.

(Continued)

*Primary Examiner* — Bradley Duckworth
(74) *Attorney, Agent, or Firm* — COATS & BENNETT, PLLC

(57) ABSTRACT

A bracket assembly with a latch plate and a lock plate. The lock plate is mounted in an overlapping arrangement with the latch plate and movable between an unlocked position and a locked position. First openings extend through the latch plate and are arranged to receive fasteners that protrude from the display. Second openings extend through the lock plate and are arranged to receive the fasteners. The second openings have a first portion aligning with the first openings in the latch plate when the lock plate is in the unlocked position to enable the bracket assembly to slide relative to the display in a first direction and a second portion enabling the lock plate to slide in a second direction relative to the latch plate between the locked and unlocked positions. A latch mechanism is configured to secure the lock plate in the locked position.

12 Claims, 14 Drawing Sheets

(56) References Cited

U.S. PATENT DOCUMENTS 11,549,640 B2 * 1/2023 Tsorng ................... F16M 11/22
11,732,511 B1 * 8/2023 Lim ....................... G06F 1/181
248/552

OTHER PUBLICATIONS

Vivo, "VESA Quick Release Adapter: Stand-VAD2", pp. 1-8, retrieved on Oct. 12, 2022, retrieved from internet: https://vivo-us.com/products/stand-vad2.

* cited by examiner

BRACKET ASSEMBLY

BACKGROUND

The Video Electronics Standards Association (VESA) is the organization responsible for defining the standards involved with mounting computer monitors, TVs, and other flat panel displays to fixtures. Most modern flat-panel monitors, TVs, and bracket assemblies are designed to comply with VESA standards to maintain universal compatibility. For example, compliant displays may include a four-hole pattern ideally on the back of the display to fit compatible screws into the holes of a mounting assembly.

BRIEF DESCRIPTION OF THE DRAWINGS

Aspects of the present disclosure are illustrated by way of example and are not limited by the accompanying figures with like references indicating like elements.

DETAILED DESCRIPTION

Conventional VESA-compliant mounting systems usually require multiple part assemblies, fasteners, and additional hand tools for mounting. Current, designs for these brackets require a multi-step and multi-part assembly and mounting. In these designs, mounting requires manually aligning the bracket assembly parts, for example, hooks, plates, rails, latches, and/or fastener holes, and subsequently connecting the parts manually by aligning fasteners with a hand tool. In this case, it may be cumbersome to install the bracket assembly.

The present application is directed to a bracket assembly for mounting a display to a fixture. The bracket assembly includes minimal parts making for an easy user installation. The minimal parts of the bracket assembly include mounting mechanisms configured to restrict the directional movement of the display relative to the bracket assembly as the display is mounted onto the bracket. The restriction of directional movement causes the display to remain stably mounted to the bracket, even when the display is repositioned in another orientation.

Figure 1:
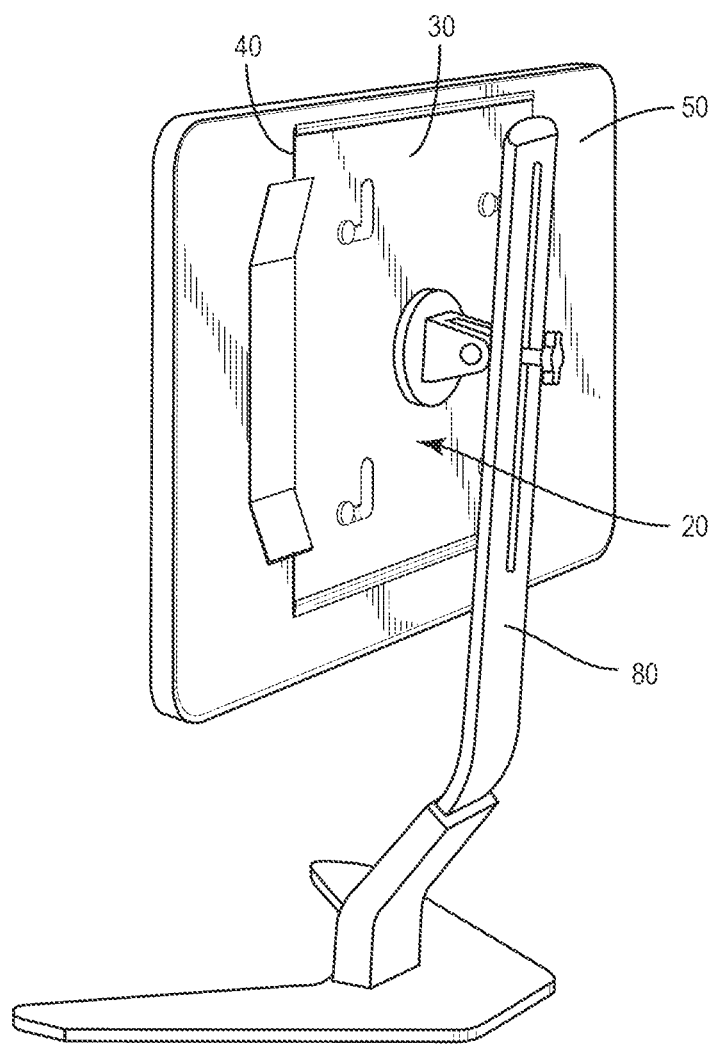
FIG. 1 is a perspective view of a bracket assembly for mounting a display to a fixture.

FIG. 1 illustrates a bracket 20 that attaches a display 50 to a fixture 80. The bracket assembly 20 includes a lock plate 30 and a latch plate 40 positioned in an overlapping arrangement. The plates 30, 40 are movable relative to one another to move between a locked position that locks the display 50 onto the fixture 80 and an unlocked position to remove the display 50 from the fixture 80.

Figure 2:
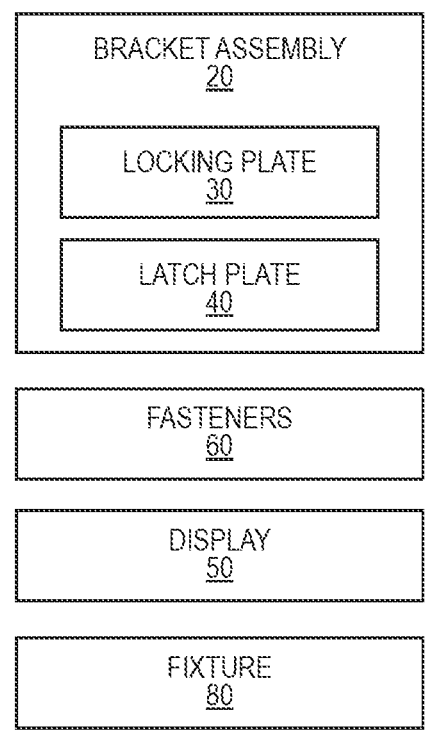
FIG. 2 is a block diagram of a bracket assembly, fasteners, display, and fixture.

As illustrated in FIG. 2, the bracket assembly 20 includes the lock plate 30 and the latch plate 40. Fasteners 60 that extend outward from the display 50 provide for engaging with the bracket assembly 20 to secure to the fixture 80.

The display 50 can include various electronic display devices including but not limited to a television monitor, computer monitor, and various flat panel display screens. The fixture 80 can include various structures that are VESA-compatible and configured to support the display 50 with examples including but not limited to a pole, a wall, and various mounts. The fasteners 60 comprise mechanical structures including but not limited to bolts, rivets, and extension members. In one example, the fasteners 60 are connected to and extend outward from one or both of the display 50 and/or fixture 80.

Figure 3:
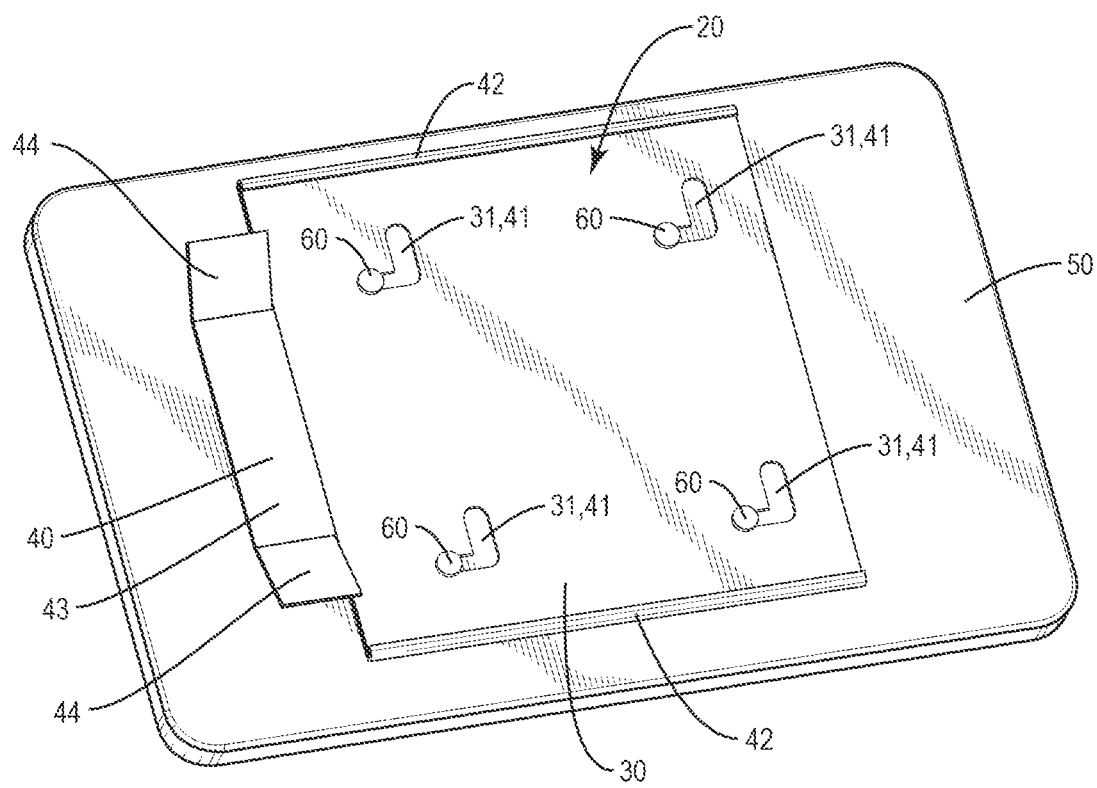
FIG. 3 is a perspective view of a bracket assembly affixed to a display.

FIG. 3 illustrates a bracket assembly 20 connected to a back side of a display 50. The fixture 80 which is attached to the lock plate 30 is removed from this drawing for clarity. The latch plate 40 and lock plate 30 are in an overlapping arrangement with the latch plate 40 positioned between lock plate 30 and display 50. Fasteners 60 that are connected to and extend outward from the display 50 are positioned through openings 31, 41 in the lock plate 30 and latch plate 40 respectively.

Figure 4:
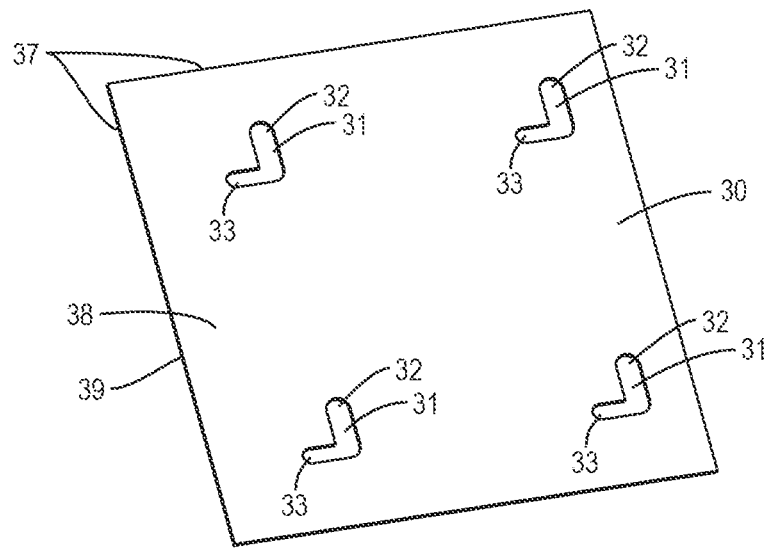
FIG. 4 is a perspective view of a lock plate.

FIG. 4 illustrates the lock plate 30. The lock plate 30 includes a front face 38, opposing back face 39, and outer edges 37. When attached, the back face 39 faces towards and contacts against the latch plate 40. Each of the faces 38, 39 is flat although other examples include one or both faces having other configurations. FIG. 4 includes the lock plate 30 having a rectangular shape with four outer edges 37. The lock plate 30 can also include various other shapes and sizes.

Openings 31 extend through the lock plate 30 and are spaced apart on the faces 38, 39. In one example, the openings 31 are arranged is a substantially rectangular arrangement in two pairs corresponding to the VESA mount configuration. The openings 31 can include various shapes and sizes including but not limited to circular, polygonal, and oval. The different openings 31 can include the same or different shapes and/or sizes. In one example as illustrated in FIG. 4, the openings 31 include a first portion 32 and a second portion 33. The first portion 32 and the second sections 33 are in communication.

Figure 5:
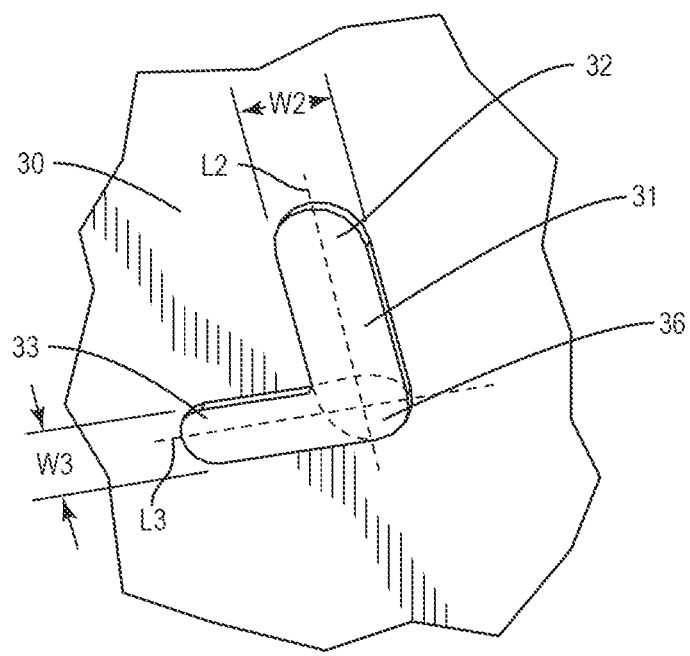
FIG. 5 is a perspective view of an opening in the lock plate.

FIG. 5 illustrates one of the openings 31 that includes the first portion 32 and the second portion 33. Each of portions 32, 33 includes a longitudinal axis L2, L3 respectively. The longitudinal axes L2, L3 are each straight and aligned in a non-parallel configuration. In one example, the longitudinal axes L2, L3 are perpendicular. In another example, the longitudinal axes L2, L3 are non-perpendicular. The two portions 32, 33 further include width W2, W3 respectively. The width W2 of the first portion 32 is larger than the width W3 of the second portion 33.

Figure 6:
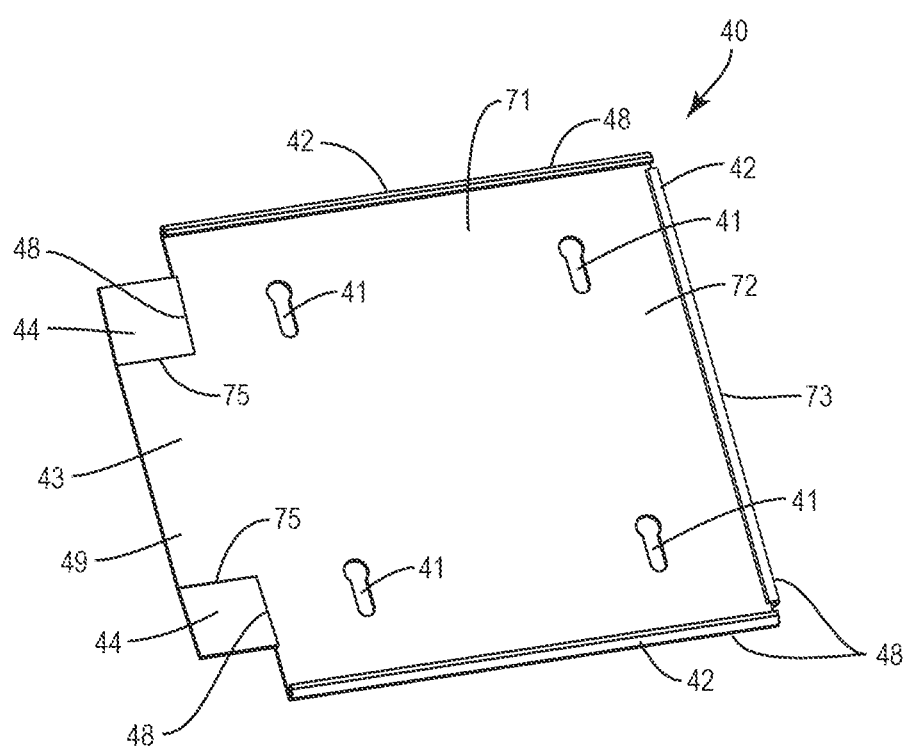
FIG. 6 is a perspective view of a latch plate.

FIG. 6 illustrates the latch plate 40 that includes a main body 71 and an integral latch mechanism 49. The main body 71 includes a front face 72 and an opposing back face 73. When attached, the front face 72 faces towards and contacts against the lock plate 30. Each of the faces 72, 73 is flat although other examples include one or both faces having other configurations. The body 71 includes outer edges 48. In one example as illustrated in FIG. 6, the body 71 has a rectangular shape with four outer edges 48. The latch plate 40 can also include various other shapes and sizes. In one example, the body 71 has the same shape as the lock plate 30.

A wall 42 extends along one or more of the outer edges 48. The wall 42 extends outward beyond the front face 72 and functions to position the lock plate 30 over the body 71. The wall 42 can extend along the entire length of the outer edge 48 or a limited section of the outer edge 48. In one example as illustrated in FIG. 3, a pair of walls 42 extend along opposing outer edges 48. Additionally or alternatively as illustrated in FIG. 6, a wall 42 extends along an outer edge 48 opposite from the latch mechanism 49.

The walls 42 can include various shapes. In one example, the walls 42 form channels that are extend around the outer edge 37 and a portion of the front face 38 of the lock plate 30. In another example, the walls 42 include a straight edge that abuts against the outer edge 37.

Figure 7A:
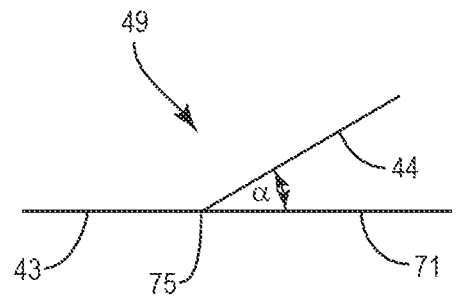
FIG. 7A is a schematic side view of a latch mechanism in a locked position.
Figure 7B:
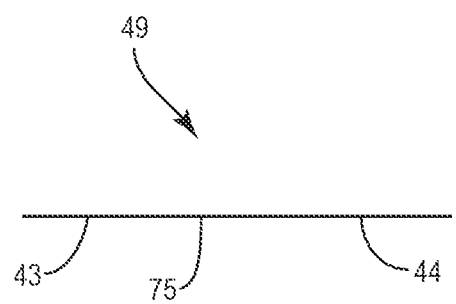
FIG. 7B is a schematic side view of the latch mechanism of FIG. 7A in an unlocked position.

The latch mechanism 49 is integral with the body 71 and positioned along one of the outer edges 48. The latch mechanism 49 is configured to lock the bracket assembly 20. The latch mechanism 49 includes a central section 43 and one or more tabs 44. The central section 43 is aligned with the body 71. As illustrated in FIGS. 6, 7A, and 7B, the central section 43 is aligned in a common plane with the body 71. In one example, the body 71 and the latch mechanism 49 are constructed from the same sheet of material.

The one or more tabs 44 are connected to the central section 43 but not to the body 71. The tabs 44 are connected at an elbow 75 to the central section 43. In one example, the central section 43 and the tabs 44 are constructed from a single sheet of material and the elbows 75 are a bend formed in the sheet. The elbows 75 are configured for the tabs 44 to be flexible to move relative to the central section 43. The flexibility provides for the tabs 44 to move between a locked position as illustrated in FIG. 7A and an unlocked position as illustrated in FIG. 7B. When no external forces are acting on the tabs 44, the tabs 44 are flexed outward from the central section 43 as illustrated in FIG. 7A. In one example, the tabs 44 are positioned at an acute angle α relative to the body 71. This flexed position extends outward beyond the body 71 to provide an abutment edge for the lock plate 30 in the locked position. In the unlocked position as illustrated in FIG. 7B, the tabs 44 flex about the elbow 75. The unlocked position aligns the tabs 44 with the central section 43 and the body 71.

In one example, the latch plate 40 is formed from a single material sheet. The latch mechanism 49 is made by forming two cuts that separate the tabs 44 from the body 71. The tabs 44 are bent to form the elbows 75.

The body 71 of the latch plate 40 includes a plurality of openings 41. The openings 41 can include various shapes and sizes including but not limited to circular, oval, and polygonal. The openings 41 in the latch plate 40 are positioned to align with the openings 31 in the lock plate 30. FIG. 6 illustrates an example that matches with the lock plate of FIG. 4. The latch plate 40 includes four openings 41 aligned in two pairs.

Figure 8:
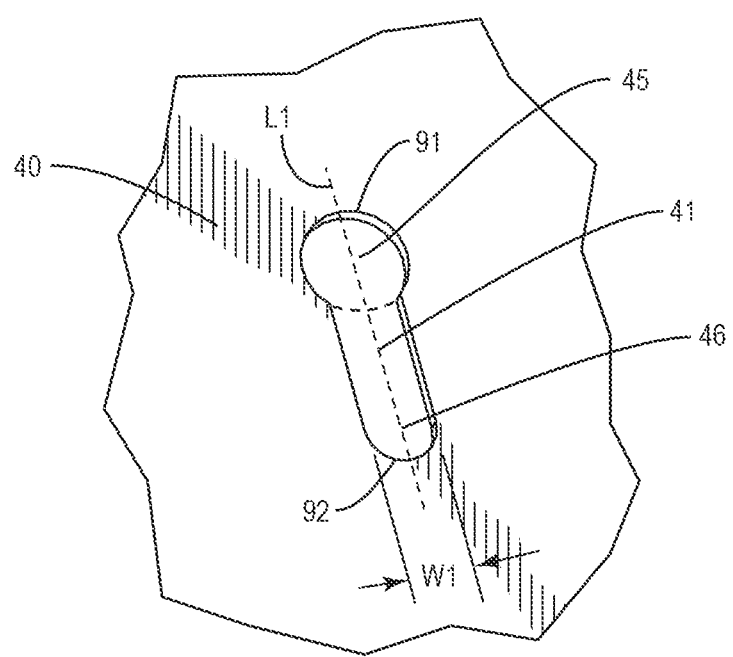
FIG. 8 is a perspective view of an opening in a latch plate.

FIGS. 6 and 8 illustrate an example with the openings 41 formed as slots that include an elongated shape having a length measured between a first end 91 and a second end 92. The openings 41 have a straight shape with a longitudinal axis L1 that extends between the ends 91, 92. The openings 41 include a width W1 measured across slot 41 and perpendicular to the longitudinal axis L1. The width W1 varies between a first section 45 at the first end 91 and a second section 46 at the second end 92. The first section 45 includes a larger width W1 than the second section 46.

Figure 9:
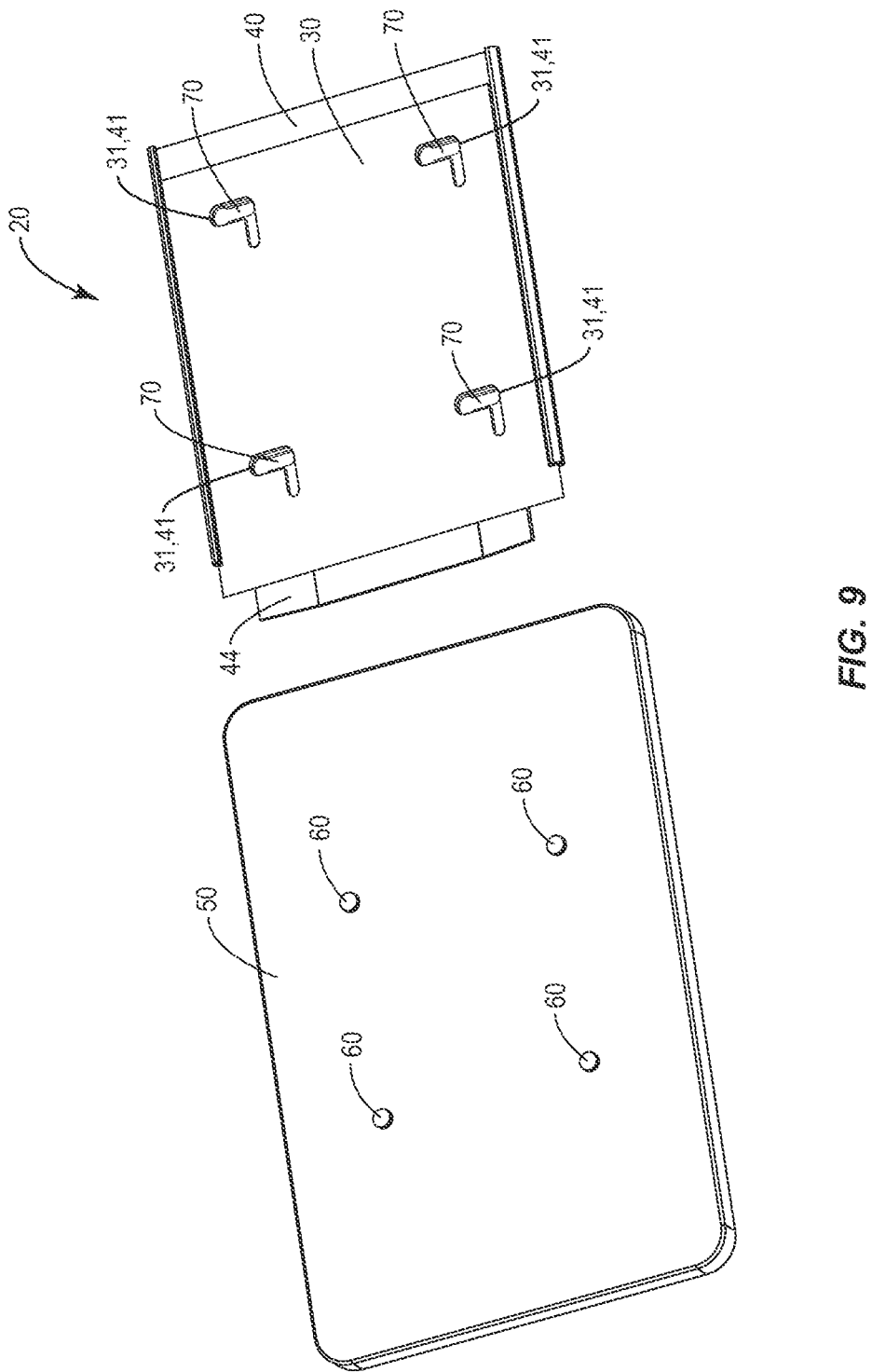
FIG. 9 is a perspective view of a bracket assembly positioned in proximity to a display.
Figure 10:
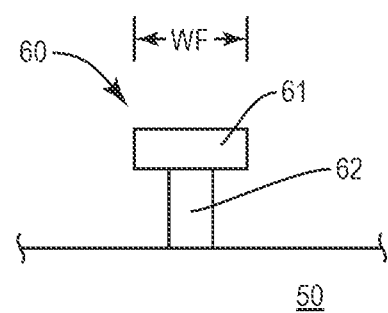
FIG. 10 is a schematic side view of a fastener extending outward from a back side of a display.

FIG. 9 illustrates a bracket assembly 20 positioned in proximity to a display 50. The lock plate 30 and latch plate 40 are aligned in an unlocked position with the openings 31, 41 aligned to form keyholes 70. The keyholes 70 are aligned in a configuration that corresponds to the fasteners 60 that extend outward from the display 50. In one example as illustrated in FIG. 10, the fastener 60 includes an enlarged head 61 mounted at the end of the shaft 62.

Figure 11:
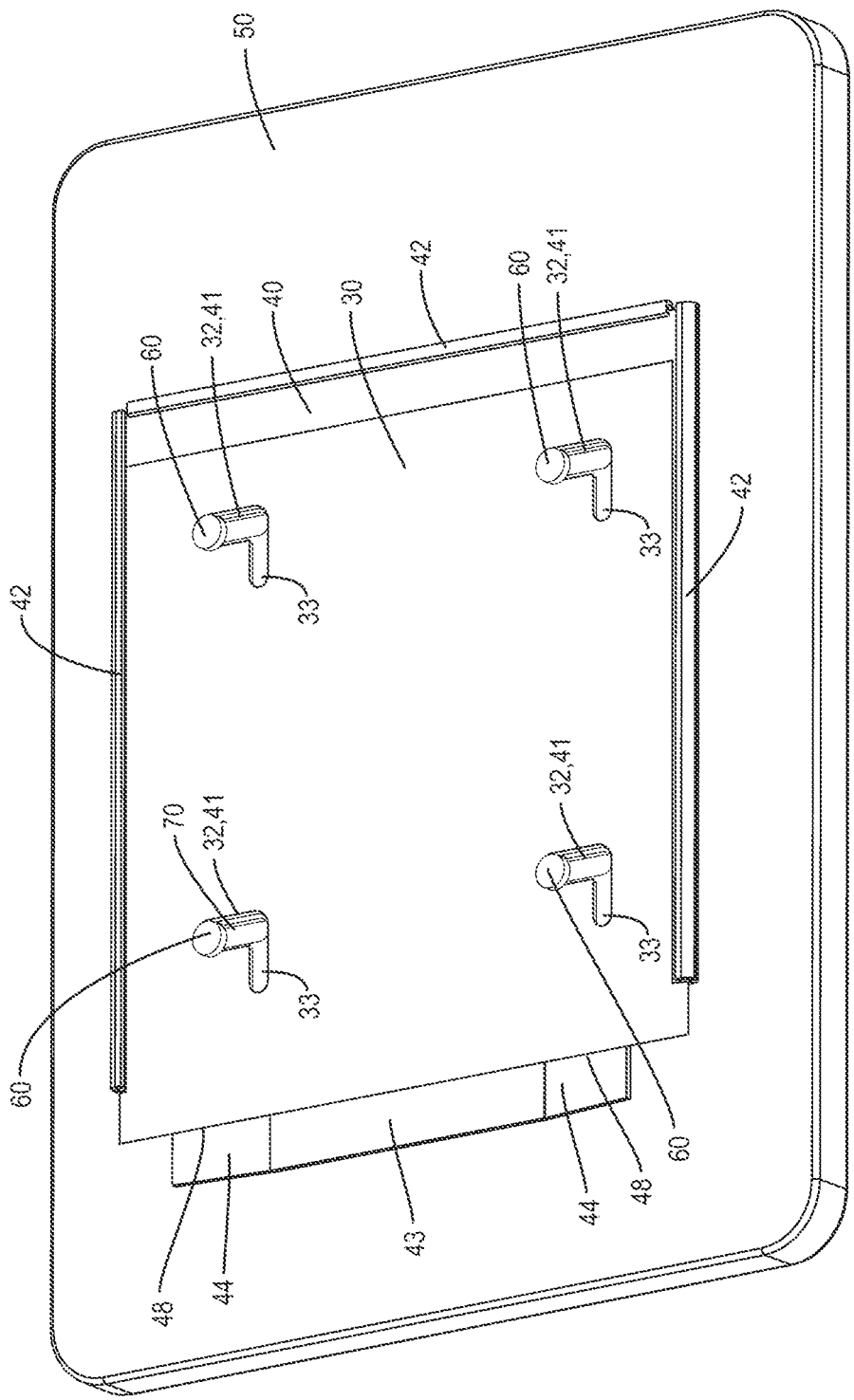
FIG. 11 is a perspective view of a bracket assembly positioned on a display and in a first unlocked position.

During mounting as illustrated in FIG. 11, the protruding fasteners 60 are slid through the keyholes 70 of the bracket assembly 20. In one example, the fasteners 60 are inserted into the keyholes 70 at a point where the first section 45 of the first opening 41 is aligned with the first section 32 of the opening 31. The first section 45 includes the larger width W1 than the second section 46 (see FIG. 8) to accommodate the enlarged head 61 of the fastener 60.

Figure 12:
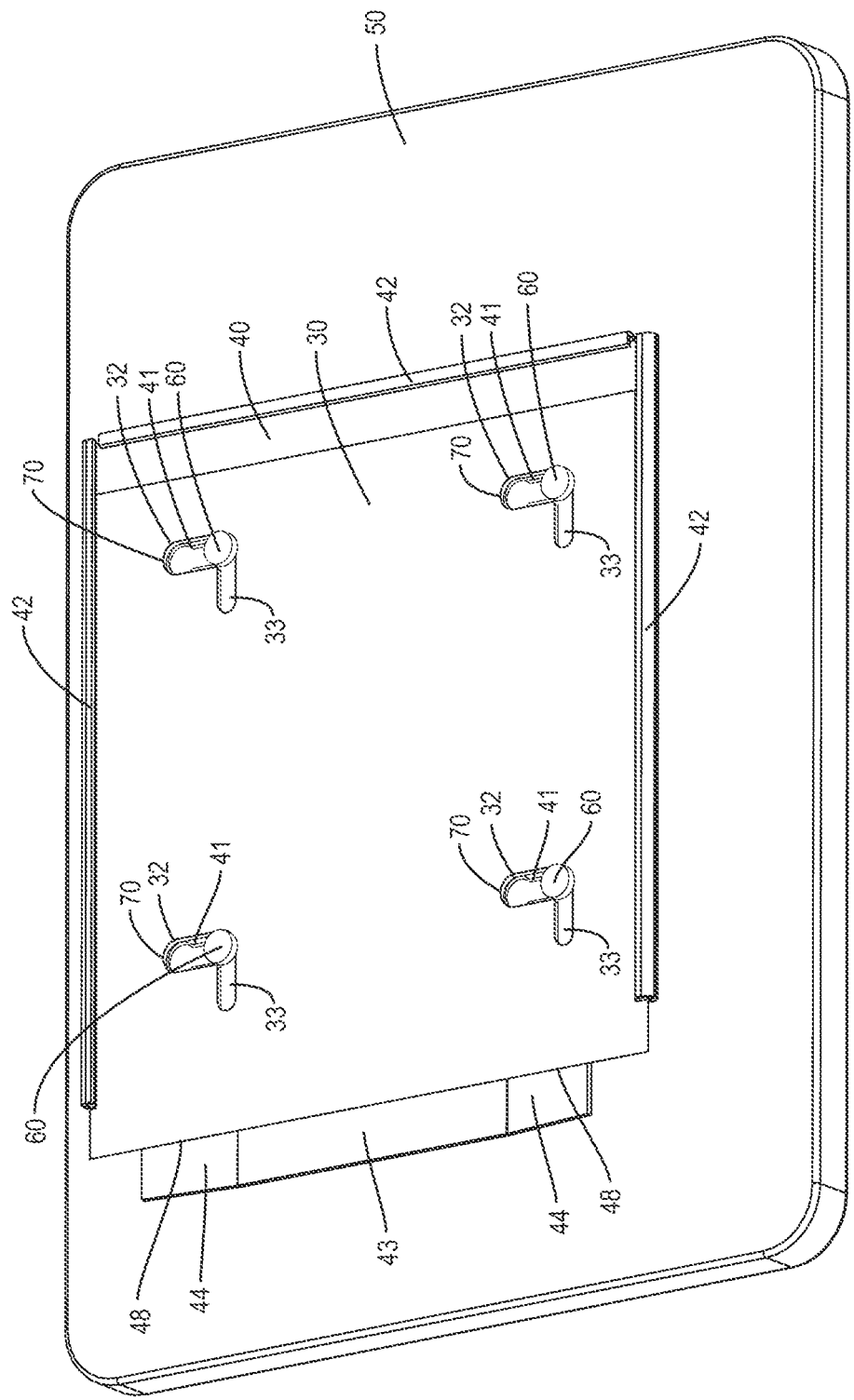
FIG. 12 is a perspective view of the bracket assembly of FIG. 11 positioned on a display and in a second unlocked position.

After the fasteners 60 are inserted into the keyholes 70, the display 50 is moved in a first direction (e.g., downward) relative to the bracket assembly 20 as illustrated in FIG. 12. This includes the fasteners 60 being moved along the keyholes 70 and into the second section 46 of the openings 41. The second section 46 includes a smaller width W1 (see FIG. 8). The smaller width W1 accommodates the shaft 62, is smaller than the width WF of the head 61 of the fastener 60 (see FIG. 10). This prevents the display 50 from being pulled apart from the bracket assembly 20.

FIGS. 11 and 12 include the locking mechanism 49 positioned underneath the lock plate 30. This positions the one or more tabs 44 in a relatively straight configuration as illustrated in FIG. 7B.

Figure 13:
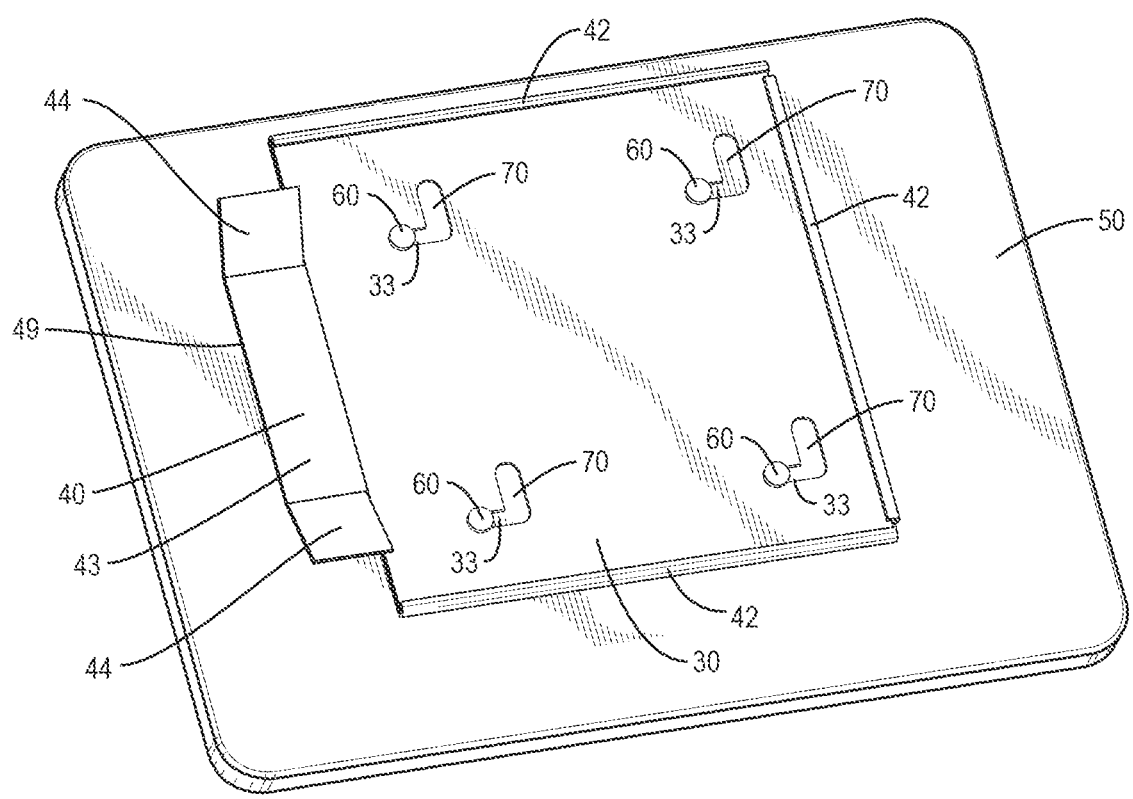
FIG. 13 is a perspective view of the bracket assembly of FIG. 12 positioned on a display and in a locked position.

As illustrated in FIGS. 11 and 12, the fasteners 60 are positioned within the first portion 32 of the opening 31. To lock the bracket assembly 20, the display 50 is moved in a second direction (e.g., laterally) relative to the bracket assembly 20. This movement slides the fasteners 60 into the second portion 33 of the openings 31 as illustrated in FIG. 13. This motion also moves the lock plate 30 away from the lock mechanism 49 (i.e., in a non-overlapping arrangement). This causes the one or more tabs 44 to flex outward and extend beyond the edge of the lock plate 30. This prevents the lock plate 30 from sliding relative to the latch plate 40 back over the lock mechanism 49.

As illustrated in FIG. 13, the bracket assembly 13 is in a locked position. The fastener 60 is positioned in the second section 46 of the opening 41 and the second portion 33 of opening 31 which each including a smaller width than the width WF of the head 61 of the fastener 60. This prevents the display 50 from being pulled away from the bracket assembly 20. The one or more tabs 44 extend outward and above the edge of the lock plate 30 preventing relative movement of the lock plate 30 in that direction. The fasteners 60 are positioned at the ends of the second portions 33 thus preventing movement in that direction. Additionally or alternatively, an outer wall 42 on the opposing side of the latch plate 40 from the latch mechanism 49 prevents movement in that direction.

In one example, the outer walls 42 include channels. The outer edges 37 of the lock plate 30 slide in the channels when moving along the second portion 33 of the opening 31.

Figure 14A:
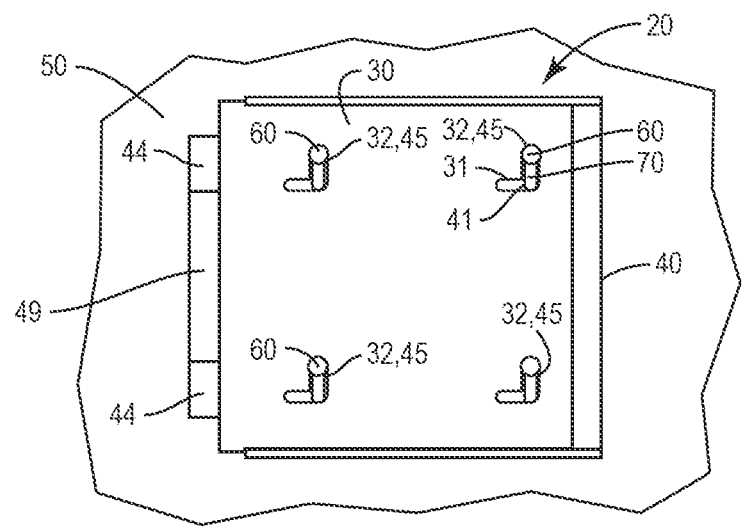
FIGS. 14A-14C are schematic plan views of a bracket assembly being connected to a display.
Figure 14B:
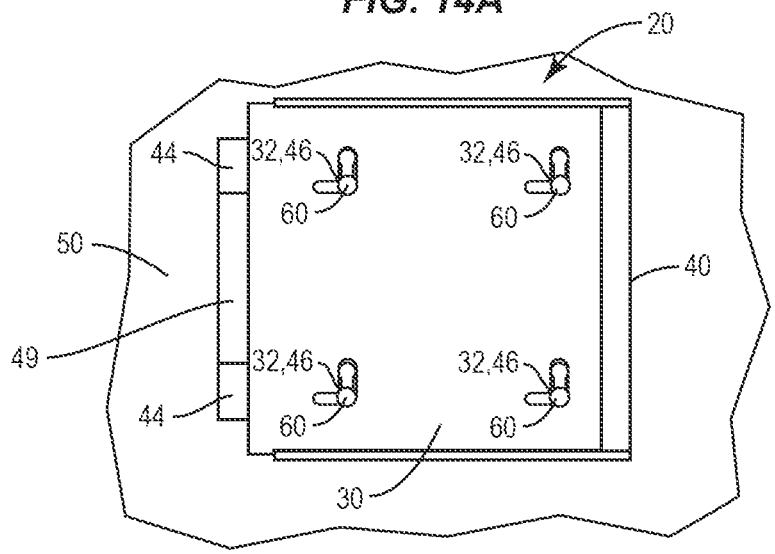
Figure 14C:
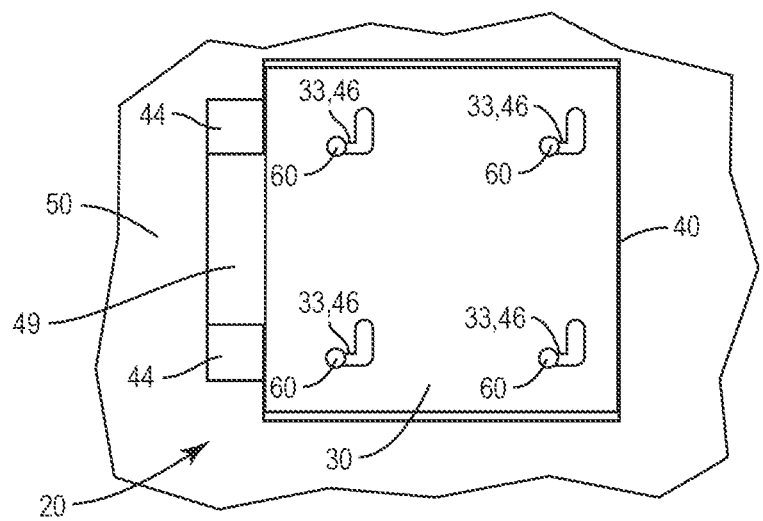

FIGS. 14A-14C illustrate the bracket assembly 20 transitioning from an unlocked position to a locked position. As illustrated in FIG. 14A, the bracket assembly 20 is in an unlocked position. Each of the fastener 60 is inserted into the aligned first portion 32 of opening 31 and first section 45 of opening 41. The tabs 44 are overlapping by the lock plate 30. This positioning flattens the tabs 44.

FIG. 14B illustrates the bracket assembly 20 slid relative to the display 50. The lock plate 30 and the latch plate 40 remain in fixed relative position. The fasteners 60 are moved along the first portion 32 of the opening 31 and into the second section 46 of opening 41. The lock plate 30 remains overlapping with the latch mechanism 49. This maintains the tabs 44 in a flatten shape.

FIG. 14C illustrates the motion of a bracket assembly 20 in the locked position. The display 50 is moved laterally relative to the bracket assembly 20. This moves the fasteners 60 into the second portion 33 of the openings 31 while remaining in the second sections 46 of openings 41. The lock plate 30 moves away from the latch mechanism 49. This non-overlapping positioning causes the tabs 44 to spring outward and extend above the edge of the lock plate 40.

The bracket assembly 20 is configured for the lock plate 30 and the latch plate 40 to be in an overlapping arrangement. These two components can slide relative to one another between the locked and unlocked positions. In one example, the lock plate 30 and the latch plate 40 are mated together through one or more guide channels formed by the outer walls 42 and the fasteners 60 that extend through the openings 31, 41. The extent of movement of the lock plate 30 is constrained relative to the latch plate 40 by the outer walls 42 and latch mechanism 49.

Figure 15:
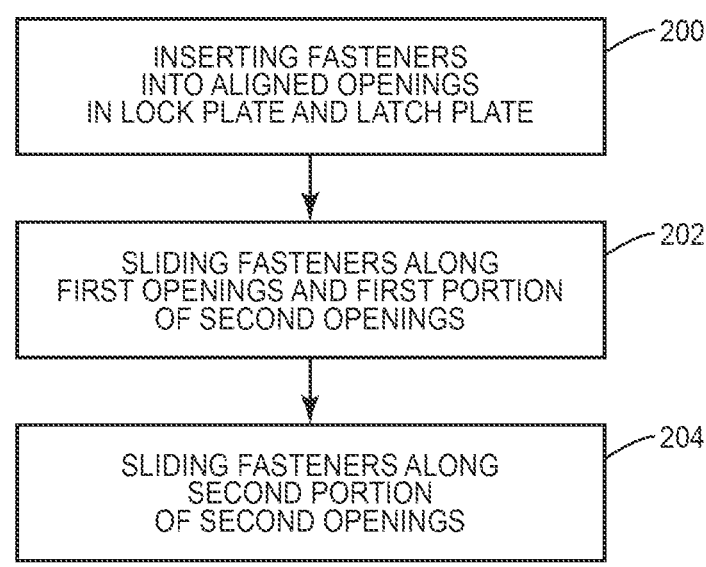
FIG. 15 is a flowchart diagram of a method of mounting a bracket assembly to a display.

FIG. 15 illustrates a method of mounting a display 50 to a fixture 80 with a bracket assembly 20. The method includes receiving fasteners 60 that protrude outward from the display 50 in first openings 41 of the latch plate 40 and a first portion 32 of second openings 31 of the lock plate 30 (block 200). After the fasteners 60 are inserted, the fasteners 60 are slid along the first openings 41 and along the first portion 32 of the second openings 31 (block 202). With the fasteners 60 remaining at a position in the first openings 41, the fasteners 60 are slid along a second portion 33 of the second openings 31 (block 204). The first portion 32 and the second portion 33 are aligned at different angles along the lock plate 30. In one example, the bracket assembly 20 is already attached to the fixture 80 prior to engaging with the display 50. In another example, the bracket assembly 20 is attached to the display 50 prior to being attached to the fixture 80.

In another example of attaching the bracket assembly 20 to the display 50, the openings 41 in the latch plate 40 have a round shape. The fasteners 60 on the display are inserted into the openings 41 and the display 50 is secured to the latch plate 40 such that the latch plate 40 will not move relative to the display 50. The display 50 with the attached latch plate 40 and protruding fasteners 60 are located onto the locking plate 30 which is previously connected to the fixture 80. The display 50 and attached latch plate 40 are then moved downward and then to the side so the latch plate 40 locks onto the locking plate 30 with the locking mechanism 49.

In another example, the bracket assembly 20 is attached to the fixture 80. The bracket assembly 20 can be attached to the display 50 and the fixture 80 in various manners. In one example, the bracket assembly 20 is attached initially to the fixture 80. Once attached, the bracket assembly 20 is mounted to the display 50. In one example, the locking plate 30 is connected to the fixture 80 to attach the bracket assembly 20. This configuration provides for the bracket assembly 20 to be used as an after-market option. In another example, the locking plate 30 is integrated into the fixture 80, such as during manufacturing.

According to some examples, a display mounted to the mounting assembly may be repositioned in multiple orientations. For example, the display may be repositioned in a landscape and portrait mode without taking off the display from the fixture.

One aspect is directed to a bracket assembly for mounting a display to a fixture. The bracket assembly comprises a latch plate and a lock plate. The lock plate is configured to be connected to the fixture and slidably mounted in an overlapping arrangement with the latch plate and movable between an unlocked position and a locked position relative to the latch plate. A plurality of first openings extend through the latch plate and are arranged to receive fasteners that protrude from the display. A plurality of second openings extend through the lock plate and are arranged to receive the fasteners. The second openings have a first portion aligning with the first openings in the latch plate when the lock plate is in the unlocked position to enable the bracket assembly to slide relative to the display in a first direction and a second portion enabling the lock plate to slide in a second direction relative to the latch plate between the locked and unlocked positions. A latch mechanism is disposed on the latch plate and configured to secure the lock plate in the locked position.

In another aspect, the latch plate comprises a body and the latch mechanism is integrally connected to a side of the body with the latch mechanism comprising a planar section that is aligned in a common plane with the body and at least one flexible tab integrally connected to the planar section and configured to be extend outward from the common plane of the body and the planar section in the locked position.

In another aspect, the flexible tab is movable between a first position that is aligned in the common plane when the unlocked position and outward from the common plane in the locked position.

In another aspect, outer walls extend outward along opposing sides of the latch plate with the outer walls configured to receive outer edges of the lock plate.

In another aspect, the locked position comprises opposing ones of the outer edges of the lock plate positioned in guide channels formed in the outer walls and the fasteners are positioned in the first openings of the latch plate and in the second portion of the second openings of the lock plate.

In another aspect, the unlocked position comprises opposing ones of the outer edges of the lock plate positioned in guide channels formed in the outer walls and the fasteners positioned in the first openings of the latch plate and in the first portion of the second openings of the lock plate.

In another aspect, the plurality of first openings in the latch plate comprise I-shaped openings and the plurality of second openings in the lock plate comprise L-shaped openings that comprise the first portion and the second portion.

One aspect is directed to a bracket assembly for mounting a display to a fixture. The bracket assembly comprises a latch plate comprising a plurality of first openings arranged to receive fasteners protruding from the display. A lock plate is positioned in an overlapping arrangement with the latch plate and comprises a plurality of second openings arranged to overlap with the first openings to receive the fasteners. The second openings comprise a first portion with a first longitudinal axis and a second portion with a second longitudinal axis with the first and second longitudinal axes aligned in a non-parallel configuration. The latch plate and the lock plate are movable between a locked position and an unlocked position. In the locked position, the latch plate and the lock plate are aligned with the fasteners positioned in the first openings of the latch plate and the second portion of the second openings of the lock plate. In the unlocked position, the latch plate and the lock plate are aligned with the fasteners positioned in the first openings of the latch plate and the first portion of the second openings of the lock plate.

In another aspect, the latch plate comprises a body with outer walls positioned on opposing sides and a latch mechanism positioned along an edge of the body and extending between the outer walls.

In another aspect, the outer walls comprise channels configured to receive outer edges of the lock plate.

In another aspect, the outer walls extend along each side of the latch plate that is positioned away from the latch mechanism.

In another aspect, the latch mechanism comprises a central section that is aligned in a common plane with the body and at least one flexible tab attached to the body and configured to flex between a first position that is aligned in the common plane and a second position that extends outward from the common plane.

In another aspect, the at least one flexible tab extends from the central section at an acute angle in the second position to be positioned outward from the body in the locked position.

In another aspect, the plurality of first openings in the latch plate comprise I-shaped openings and the plurality of second openings in the lock plate comprise L-shaped openings.

One aspect is directed to a method of mounting a display to a fixture. The method comprises: receiving a plurality of fasteners protruding from the display in a plurality of first openings of the latch plate and a first portion of a plurality of second openings of the lock plate; sliding the fasteners along the first openings and along the first portion of the second openings; and with the fasteners remaining at a position in the first openings, sliding the fasteners along a second portion of the second openings with the first portion and the second portion aligned at different angles along the lock plate.

In another aspect, the method further comprises sliding the fasteners along the first openings and along the first portion of the second openings and maintaining a relative position between the latch plate and the lock plate.

In another aspect, the method further comprises sliding the fasteners along the second portion of the second openings and moving the latch plate relative to the lock plate.

In another aspect, moving the latch plate relative to the lock plate exposes at least one flexible tab.

In another aspect, the method further comprises extending the least one flexible tab above a main section of the latch plate.

In another aspect, the method further comprises sliding outer edges of the lock plate within channels along outer walls of the latch mechanism.

By the term "substantially" with reference to amounts or measurement values, it is meant that the recited characteristic, parameter, or value need not be achieved exactly. Rather, deviations or variations, including, for example, tolerances, measurement error, measurement accuracy limitations, and other factors known to those skilled in the art, may occur in amounts that do not preclude the effect that the characteristic was intended to provide.

The present disclosure may be carried out in other ways than those specifically set forth herein without departing from essential characteristics of the present disclosure. The present embodiments are to be considered in all respects as illustrative and not restrictive, and all changes coming within the meaning and equivalency range of the appended claims are intended to be embraced therein.

What is claimed:

1. A bracket assembly to mount a display to a fixture, the bracket assembly comprising:
   a latch plate;
   a lock plate configured to be connected to the fixture and slidably mounted in an overlapping arrangement with the latch plate and movable between an unlocked position and a locked position relative to the latch plate;
   a plurality of first openings extend through the latch plate and are arranged to receive fasteners protruding from the display;
   a plurality of second openings extend through the lock plate and are arranged to receive the fasteners, the second openings comprising a first portion aligning with the first openings in the latch plate when the lock plate is in the unlocked position to enable the bracket assembly to slide relative to the display in a first direction and a second portion enabling the lock plate to slide in a second direction relative to the latch plate between the locked and unlocked positions;
   outer walls that extend outward along opposing sides of the latch plate, the outer walls configured to receive outer edges of the lock plate; and
   a latch mechanism disposed on the latch plate and configured to lock the lock plate in the locked position.

2. The bracket assembly of claim 1, wherein the latch plate comprises:
   a body; and
   the latch mechanism integrally connected to a side of the body, the latch mechanism comprising a planar section that is aligned in a common plane with the body and at least one flexible tab integrally connected to the planar section and configured to extend outward from the common plane of the body and the planar section in the locked position.

3. The bracket assembly of claim 2, wherein the flexible tab is movable between a first position that is aligned in the common plane when in the unlocked position and extending outward from the common plane in the locked position.

4. The bracket assembly of claim 1, wherein the locked position comprises:
   opposing ones of the outer edges of the lock plate positioned in guide channels formed in the outer walls; and
   the fasteners positioned in the first openings of the latch plate and in the second portion of the second openings of the lock plate.

5. The bracket assembly of claim 1, wherein the unlocked position comprises:
   opposing ones of the outer edges of the lock plate positioned in guide channels formed in the outer walls; and
   the fasteners positioned in the first openings of the latch plate and in the first portion of the second openings of the lock plate.

6. The bracket assembly of claim 1, wherein:
   the plurality of first openings in the latch plate comprise I-shaped openings; and
   the plurality of second openings in the lock plate comprise L-shaped openings that comprise the first portion and the second portion.

7. A bracket assembly to mount a display to a fixture, the bracket assembly comprising:

a latch plate comprising a plurality of first openings arranged to receive fasteners protruding from the display;

a lock plate positioned in an overlapping arrangement with the latch plate and comprising a plurality of second openings arranged to overlap with the first openings to receive the fasteners, the second openings comprising a first portion with a first longitudinal axis and a second portion with a second longitudinal axis, the first and second longitudinal axes aligned in a non-parallel configuration;

the latch plate and the lock plate movable between a locked position and an unlocked position;

the latch plate further comprising a body with outer walls positioned on opposing sides, and a latch mechanism positioned along an edge of the body and extending between the outer walls;

wherein in the locked position, the latch plate and the lock plate are aligned with the fasteners positioned in the first openings of the latch plate and the second portion of the second openings of the lock plate; and wherein in the unlocked position, the latch plate and the lock plate are aligned with the fasteners positioned in the first openings of the latch plate and the first portion of the second openings of the lock plate.

8. The bracket assembly of claim 7, wherein the outer walls comprise channels configured to receive outer edges of the lock plate.

9. The bracket assembly of claim 7, wherein the outer walls extend along each side of the latch plate that is positioned away from the latch mechanism.

10. The bracket assembly of claim 7, wherein the latch mechanism comprises:

a central section that is aligned in a common plane with the body; and at least one flexible tab attached to the body and configured to flex between a first position that is aligned in the common plane and a second position that extends outward from the common plane.

11. The bracket assembly of claim 10, wherein the at least one flexible tab extends from the central section at an acute angle in the second position to be positioned outward from the body in the locked position.

12. The bracket assembly of claim 7, wherein:

the plurality of first openings in the latch plate comprise I-shaped openings; and the plurality of second openings in the lock plate comprise L-shaped openings.

\* \* \* \* \*